US012687580B2

(12) United States Patent
Lee et al.

(10) Patent No.: US 12,687,580 B2
(45) Date of Patent: Jul. 21, 2026

(54) SECONDARY BATTERY CELL INSULATION TEST APPARATUS AND METHOD USING THE SAME

(71) Applicant: SK On Co., Ltd., Seoul (KR)

(72) Inventors: Jeong Joo Lee, Daejeon (KR); Tak Kyung Yoo, Daejeon (KR)

(73) Assignee: SK On Co., Ltd., Seoul (KR)

( * ) Notice: Subject to any disclaimer, the term of this patent is extended or adjusted under 35 U.S.C. 154(b) by 111 days.

(21) Appl. No.: 18/594,245

(22) Filed: Mar. 4, 2024

(65) Prior Publication Data

US 2024/0302437 A1      Sep. 12, 2024

(30) Foreign Application Priority Data

Mar. 10, 2023      (KR) ........................ 10-2023-0031746

(51) Int. Cl.
| | |
|---|---|
| *G01R 31/36* | (2020.01) |
| *G01R 31/12* | (2020.01) |
| *G01R 31/389* | (2019.01) |

(52) U.S. Cl.
CPC ..... G01R 31/3644 (2013.01); G01R 31/1272 (2013.01); G01R 31/389 (2019.01)

(58) Field of Classification Search
CPC .............. G01R 31/3644; G01R 31/389; G01R 31/1272
USPC ...................... 324/500, 600, 76.11, 415–435
See application file for complete search history.

(56) References Cited

U.S. PATENT DOCUMENTS

| | | | | |
|---|---|---|---|---|
| 11,990,645 B2 * | 5/2024 | Pan | ...................... | H01M 50/218 |
| 12,347,892 B2 * | 7/2025 | Lee | .................... | H01M 10/482 |

| | | | | |
|---|---|---|---|---|
| 2011/0191043 A1 | 8/2011 | Lee et al. | | |
| 2015/0022228 A1 | 1/2015 | Motohashi et al. | | |
| 2019/0324089 A1 | 10/2019 | Kang et al. | | |
| 2020/0400747 A1 * | 12/2020 | Min | ...................... | H01M 10/48 |
| 2023/0417816 A1 * | 12/2023 | Kim | ................. | H01M 10/4285 |
| 2024/0030504 A1 * | 1/2024 | Lee | .................... | H01M 10/4285 |
| 2024/0085289 A1 * | 3/2024 | Hong | ................. | G01M 99/007 |
| 2024/0243372 A1 * | 7/2024 | He | ...................... | G01R 31/3835 |
| 2024/0255376 A1 * | 8/2024 | Han | .................... | H01M 50/105 |

FOREIGN PATENT DOCUMENTS

| | | |
|---|---|---|
| KR | 10-2010-0041213 | 4/2010 |
| KR | 10-2014-0128985 A | 11/2014 |
| KR | 10-1498617 | 3/2015 |
| KR | 10-2019-0006920 | 1/2019 |
| KR | 10-2022-0144071 A | 10/2022 |

OTHER PUBLICATIONS

KIPO, Appl. 10-2023-0031746, Office Action, Jun. 10, 2026.

* cited by examiner

*Primary Examiner* — Huy Q Phan
*Assistant Examiner* — Trung Q Nguyen
(74) *Attorney, Agent, or Firm* — Jones Day

(57)      ABSTRACT

A secondary battery cell insulation test apparatus In an embodiment of the present disclosure may include: a first probe portion disposed to be in contact with a case of a secondary battery cell; a second probe portion disposed to be contact with an electrode tab of the secondary battery cell; and a tester for measuring insulation resistance of the secondary battery cell in a state in which the first probe portion and the second probe portion are disposed to be in contact with the secondary battery cell, wherein the first probe portion may include a probe assembly to contact the case at a plurality of points.

16 Claims, 10 Drawing Sheets

2215 — 2213

2211

2211a

210

260

SECONDARY BATTERY CELL INSULATION TEST APPARATUS AND METHOD USING THE SAME

CROSS-REFERENCE TO RELATED APPLICATION(S)

This patent document claims the priority and benefits of Korean Patent Application No. 10-2023-0031746 filed on Mar. 10, 2023, the disclosure of which is incorporated herein by reference in its entirety.

TECHNICAL FIELD

The present disclosure relates to a secondary battery cell insulation test apparatus and a method using the same.

BACKGROUND

A secondary battery refers to a battery capable of repeated electrical charging and discharging because the mutual conversion between chemical energy and electrical energy is reversible. Such a secondary battery may be used as an energy source for an electric vehicle, a hybrid vehicle, and an energy storage system (ESS), which have recently attracted attention, including a mobile device.

On the other hand, insulation defects of a secondary battery interfere with normal operations thereof, such as causing low voltage, and may seriously cause fire and explosions, and therefore, it may be necessary to remove defective cells in advance by testing insulation defects on a battery cell basis.

FIGS. 1A and 1B are views illustrating examples of success and failure in detecting insulation defects of a pouch cell using a conventional insulation test apparatus.

An insulation test is performed by measuring the insulation resistance between first and second probe portions 22 and 23 through a tester 24 in a state in which the first and second probe portions 22 and 23 of a test apparatus 2 are in contact with a case 11 and a negative pole tab 13 of a pouch cell 1, respectively.

Referring to FIGS. 1A and 1B, the first probe portion 22 and the second probe portion 23 of a conventional test apparatus 2 come into point contact with the pouch cell 1. Accordingly, in order to detect insulation defects that may occur at any point of the case 11, a test must be repeatedly performed while changing a position of the first probe portion 22, and despite repeated performance, there has been a problem in that the probability of detecting insulation defects may be somewhat low.

SUMMARY

According to an aspect of the present disclosure, it is possible to provide a secondary battery cell insulation test apparatus that can perform an insulation test at several points simultaneously and an insulation test method using the device.

In an embodiment of the present disclosure, a secondary battery cell insulation test apparatus may include: a first probe portion disposed to be in contact with a case of a secondary battery cell; a second probe portion disposed to be contact with an electrode tab of the secondary battery cell; and a tester for measuring insulation resistance of the secondary battery cell in a state in which the first probe portion and the second probe portion are disposed to be in contact with the secondary battery cell, wherein the first probe portion may include a probe assembly to contact the case at a plurality of points.

In an embodiment of the present disclosure, the probe assembly may contact with the case, and includes a plurality of first probes connected to each other in one side thereof.

In an embodiment of the present disclosure, the probe assembly may further include a metal mesh supporting the plurality of first probes.

In an embodiment of the present disclosure, the plurality of first probes may be arranged at regular intervals while forming a plurality of rows and columns.

In an embodiment of the present disclosure, the plurality of first probes may be able to adjust a position in a direction facing the case.

In an embodiment of the present disclosure, ends of the plurality of first probes may be in contact with the case, and the ends of the plurality of first probes may have a flat shape or a round shape.

In an embodiment of the present disclosure, the plurality of first probes may include: a contact portion in contact with the case; an accommodation portion in which a portion of the contact portion is accommodated; and a connection portion connecting the contact portion and the accommodation portion, wherein the connection portion may be provided with an elastic member that is deformable in a longitudinal direction of the contact portion.

In an embodiment of the present disclosure, the probe assembly may further include an insulating cover on which the metal mesh is disposed.

In an embodiment of the present disclosure, the secondary battery cell insulation test apparatus may further include a cell jig on which the secondary battery cell is settled.

In an embodiment of the present disclosure, wherein the probe unit is arranged to contact a first surface of the case, the cell jig may further include a third probe portion disposed to contact a second surface of the case, and the third probe portion may include a probe assembly to come into contact with the case at a plurality of points.

In an embodiment of the present disclosure, the secondary battery cell insulation test apparatus may further include: a capturing portion to confirm and specify an insulation defect position in the secondary battery cell.

In an embodiment of the present disclosure, the secondary battery cell may be a pouch-type secondary battery cell.

In an embodiment of the present disclosure, a secondary battery cell insulation test method may include: an alignment operation of aligning a position of a secondary battery cell; a contact operation of bringing a case and an electrode tab of the secondary battery cell into contact with a first probe portion and a second probe portion, respectively; a voltage application operation of applying test voltage to the secondary battery cell in a state in which the first probe portion and the second probe portion are in contact; and a determination operation of determining whether defects are present in the secondary battery cell by measuring an insulation resistance value of the secondary battery cell, wherein the first probe portion may include a plurality of first probes to contact with the case at a plurality of points.

In an embodiment of the present disclosure, in the determination operation, when an insulation resistance value of the secondary battery cell is measured to be lower than a preset reference value, the secondary battery cell may be determined to have insulation defects.

In an embodiment of the present disclosure, the secondary battery cell insulation test method may further include, when the secondary battery cell is determined to have insulating defects, a position specifying operation of specifying an insulating defect position of the secondary battery cell through a capturing portion.

In an embodiment of the present disclosure, the plurality of first probes may be arranged at regular intervals while forming a plurality of rows and columns, and in the position specifying operation, a defect position of the secondary battery cell may be specified as a coordinate.

In an embodiment of the present disclosure, a position of the secondary battery cell may be aligned in a state in which the secondary battery cell is settled on the cell jig, the cell jig may include a plurality of third probes that form contact with the case at a plurality of points, and insulation tests are simultaneously performed on both surfaces of the case through the plurality of first probes and the plurality of third probes.

According to an aspect of the present disclosure, the reliability of an insulation test may be increased, and the time required for the test may be significantly saved. In addition, since it is possible to detect partial insulation damage in addition to serious insulation defects of a cell, the possibility of shipping a defective cell may be reduced.

BRIEF DESCRIPTION OF DRAWINGS

Certain aspects, features, and advantages of the disclosed disclosure are illustrated by the following detailed description with reference to the accompanying drawings.

DETAILED DESCRIPTION

Hereinafter, the disclosed embodiment will be described in detail with reference to the accompanying drawings. However, this is merely illustrative and the disclosed embodiment is not limited to t the specific embodiments described exemplarily. The disclosed embodiment relates to a secondary battery cell insulation test apparatus and a test method using the same, and first, referring to FIGS. 2 to 8, a secondary battery cell insulation test apparatus 200 (hereinafter, a cell insulation test apparatus or test apparatus) according to the disclosed embodiment will be described.

Figure 1A:
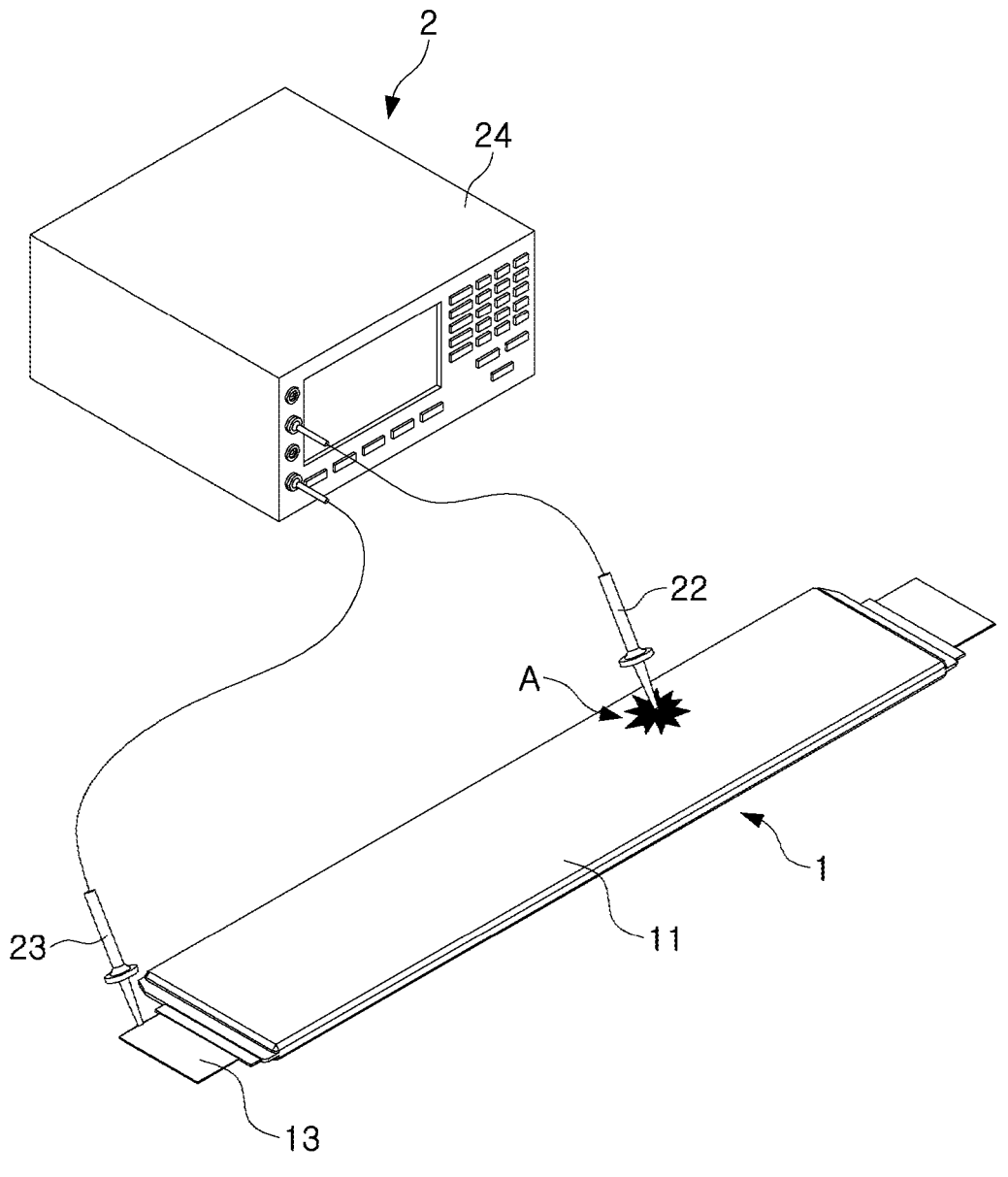
FIGS. 1A and 1B are views illustrating examples of success and failure in detecting insulation defects of a pouch cell using a conventional insulation test apparatus.
Figure 1B:
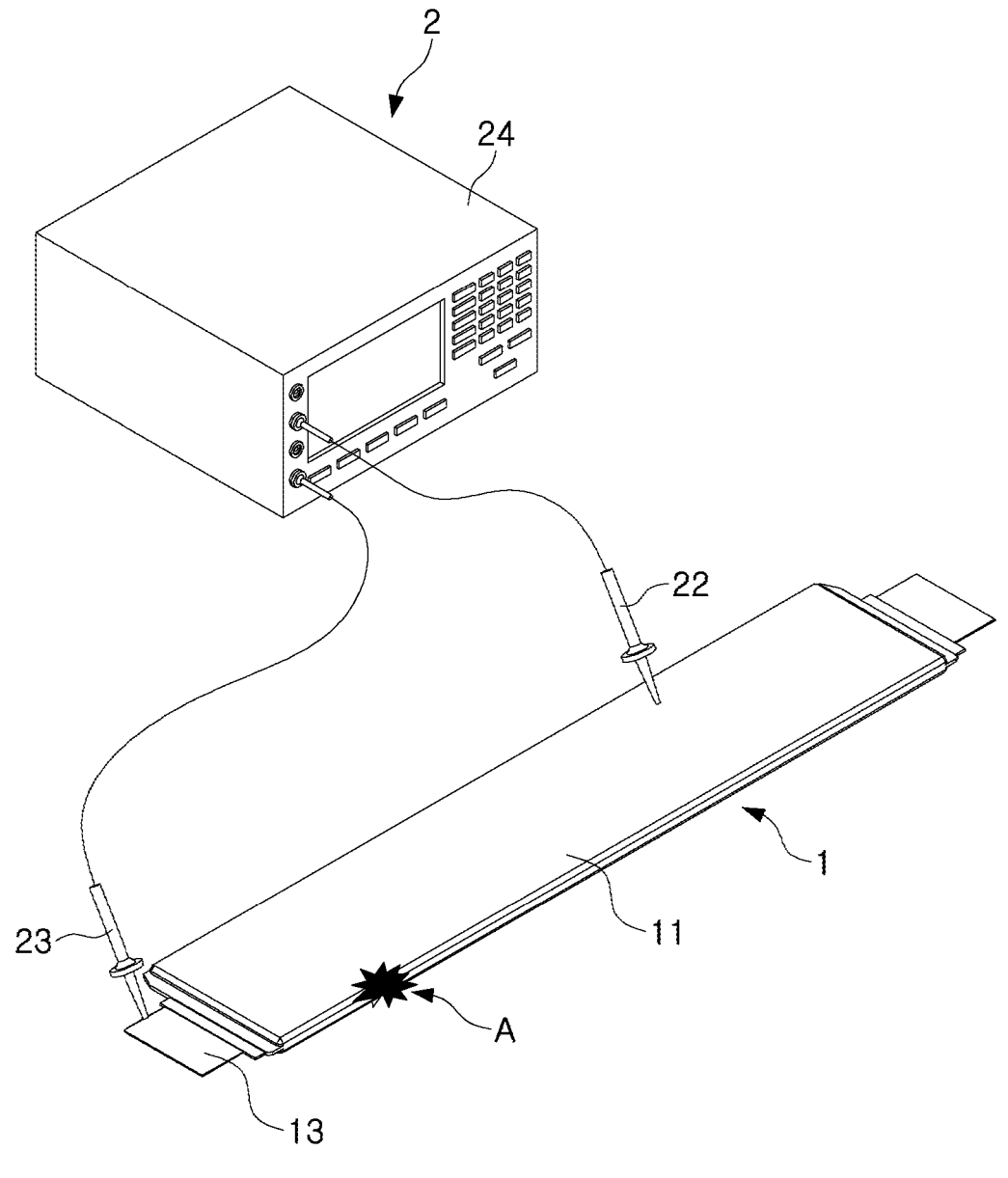
Figure 2:
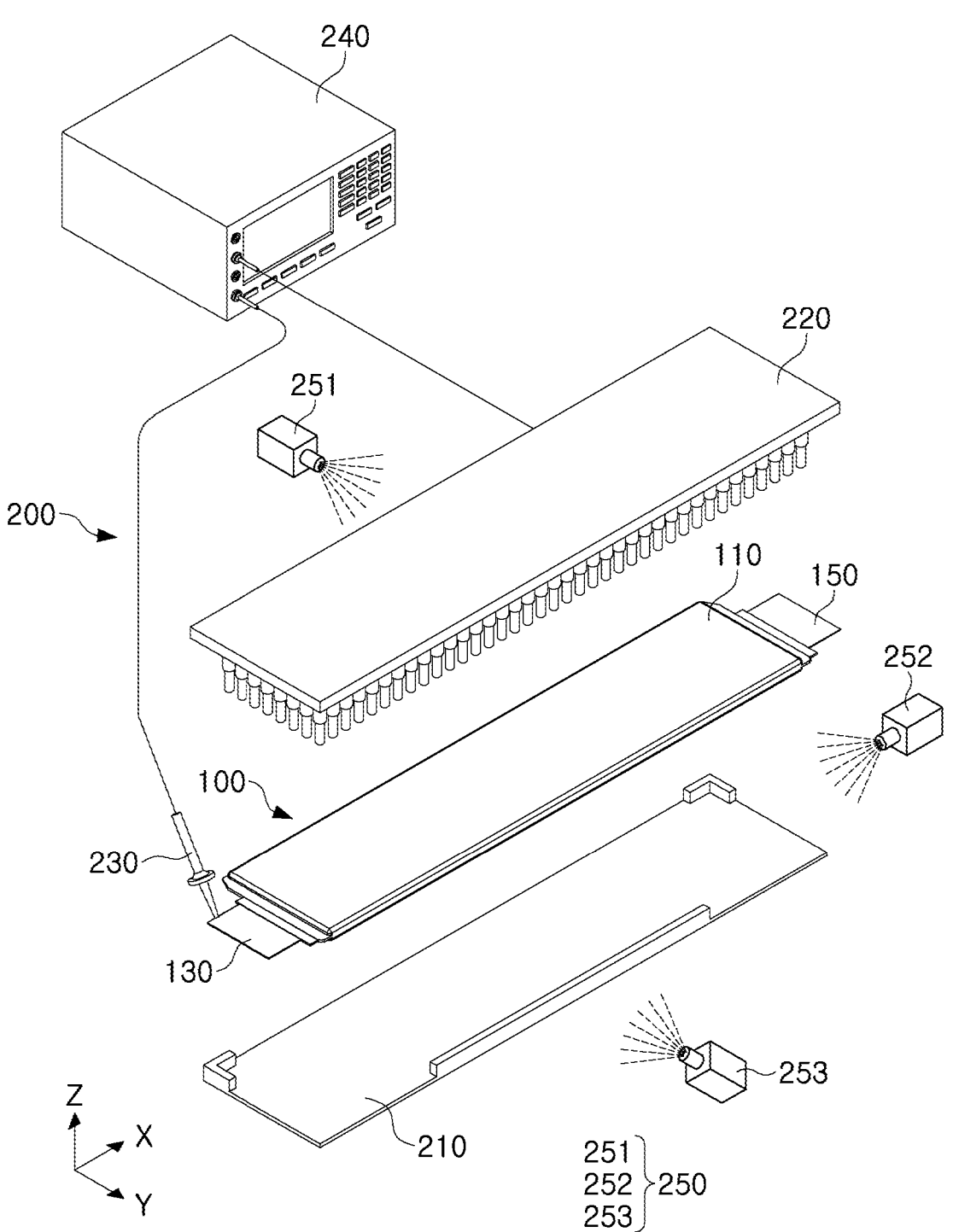
FIG. 2 is an exploded view of components of a secondary battery cell test apparatus according to an embodiment.

FIG. 2 is an exploded view of components of secondary battery cell test apparatus according to an embodiment, FIG.

Figure 3:
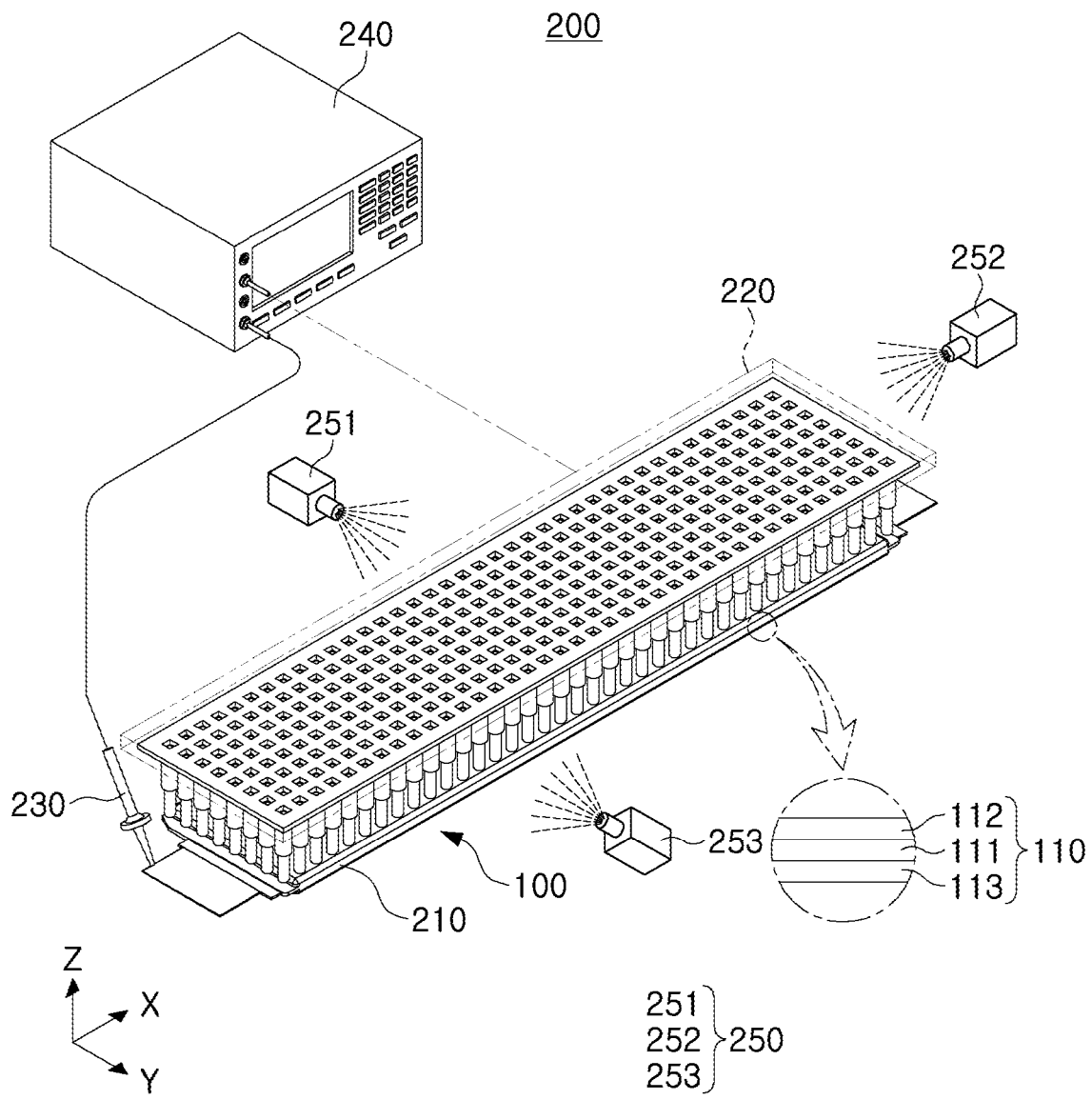
FIG. 3 is a view illustrating a setting state of the test apparatus illustrated in FIG. 2.
Figure 4:
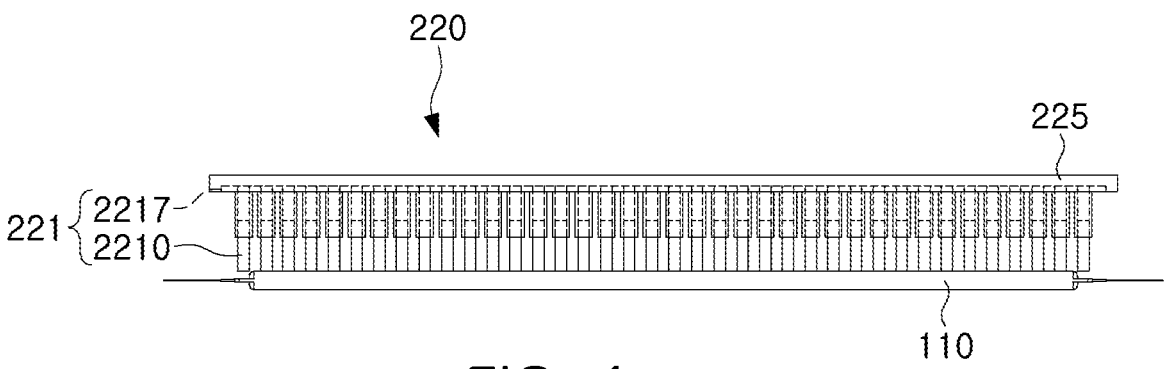
FIG. 4 is a side view of a Y-direction of FIG. 3.

3 is a view illustrating a setting state of the test apparatus illustrated in FIG. 2, and FIG. 4 is a side view of a Y-direction of FIG. 3.

The cell insulation test apparatus 200 according to the disclosed embodiment may include a cell jig 210 on which a secondary battery cell is settled, a first probe portion 220 and a second probe portion 230 in contact with the secondary battery cell 100, and a tester 240 for measuring insulation resistance. Furthermore, the cell insulation test apparatus 200 may include one or more capturing portions 250, 251, 252 and 253 for imaging a test process.

Referring to FIGS. 2 to 4, the secondary battery cell to be subjected to the insulation test may be a pouch cell 100. The pouch cell 100 may refer to a secondary battery cell in which a case accommodating an electrode assembly and an electrolyte has a pouch shape.

A case 110 of the pouch cell 100 may have insulating layers 112 and 113 stacked on both surfaces of a metal layer 111. For example, the metal layer 111 may be formed of aluminum, and the insulating layers 112 and 113 may be formed of polyethylene terephthalate (PET) or polypropylene (PP). However, the insulating layers 112 and 113 may be replaced with other materials having similar properties to those listed above.

The metal layer 111 may be electrically insulated from an exterior thereof by the insulating layers 112 and 113. However, the insulation of the pouch cell 100 may be lost due to damage to an internal structure or damage to the insulating layers 112 and 113, and the cell insulation test apparatus 200 according to the disclosed embodiment may detect such insulation defects.

The pouch cell 100 may be provided in various forms, but in an embodiment, as illustrated in the drawing, the pouch cell 100 may have a shape in which electrode tabs 130 and 150 are exposed on both sides of the case 110 in a longitudinal direction. The electrode tabs 130 and 150 are connect to negative electrode and positive electrode of an electrode assembly (not illustrated) accommodated in the case 110 A negative electrode tab 130 may extend from the negative electrode end, and a positive electrode tab 150 may extend from the positive electrode end.

According to the disclosed embodiment, the pouch cell 100 described above may be settled on the cell jig 210. A wide surface of the pouch cell 100 may be settled on the cell jig 210, and the cell jig 210 may be formed in a size in which the wide surface of the pouch cell 100 may be settled.

The cell jig 210 may include a guide wall 215. The guide wall 215 may help align a position of the pouch cell 100 so that the pouch cell 100 may be settled in a given position of the cell jig 210. The guide wall 215 may be provided to avoid the electrode tabs 130 and 150.

The first probe portion 220 and the second probe portion 230 may be disposed to come into contact with the pouch cell 100 while being connected to the tester 240. Referring to the drawing, the first probe portion 220 may be in contact with the case 110 and the second probe portion 230 may be in contact with the negative electrode tab 130.

The second probe portion 230 may include a single probe that is in point contact with the negative electrode tab 130. On the other hand, the first probe portion 220 may be provided as a probe assembly including a plurality of probes which are in point contact with the case 110. Accordingly, the cell insulation test apparatus 200 according to the disclosed embodiment may form a one-to-many contact with the pouch cell 100.

According to the disclosed embodiment, the first probe portion 220 may include a probe assembly 221 including a plurality of probes in contact with the case 110, and an insulating cover 225 on which the probe assembly 221 is settled.

The probe assembly 221 may include a plurality of probes 2210 disposed at regular intervals in a longitudinal direction (X-direction) and a width direction (Y-direction) of the pouch cell 10, and a metal mesh 2217 supporting the plurality of probes 2210. The metal mesh 2217 may be a checkerboard form in which a plurality of rows and columns formed by the plurality of probes 2210 are connected to each other. Accordingly, a position of the plurality of probes 2210 may be specified as coordinates (row and column), respectively, and a position in which defects are detected during an insulation test may be easily identified.

As an embodiment, the metal mesh 2217 may be disposed on the insulating cover 225. Since the insulating cover 225 is formed of a material having rigidity and insulating properties, the insulating cover 225 may support the metal mesh 2217 and may prevent an unintended energization situation during the insulation test. However, when the metal mesh 2217 is formed to have a sufficient thickness, or a plurality of probes may be provided in a rigid type, the metal mesh 2217 may not necessarily be disposed on the insulating cover 225.

In an embodiment of the present disclosure, the plurality of probes 2210 may be able to adjust a height in a longitudinal direction (Z-direction) thereof. Hereinafter, the plurality of probes 2210 will be described with reference to FIGS. 5 to 7.

In the following description, the probe 2210 constituting the first probe portion 220 is referred to as a first probe 2210 to distinguish the probe 2210 from a probe of the second probe portion 230.

Figure 5:
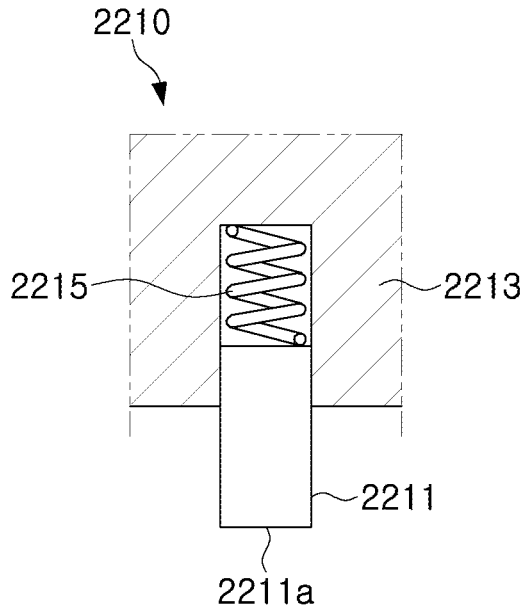
FIG. 5 is a cross-sectional view of a first probe according to an embodiment.
Figure 6:
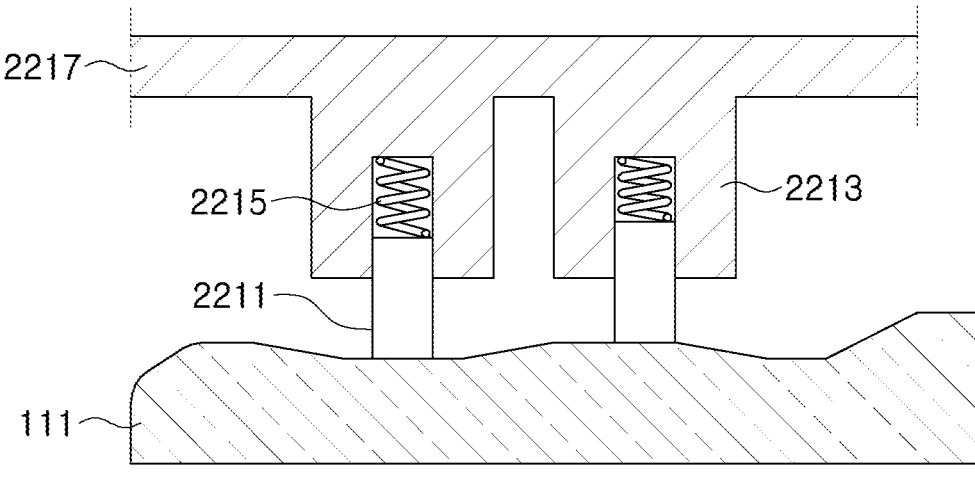
FIG. 6 is a view illustrating a function of the first probe illustrated in FIG. 5.
Figure 7:
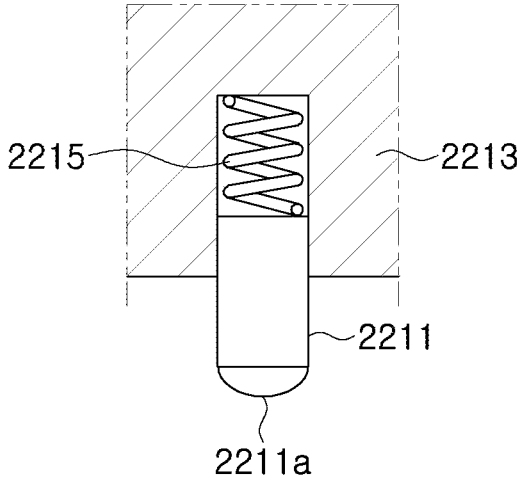
FIG. 7 is a view illustrating a modified embodiment of the first probe illustrated in FIG. 5.

FIG. 5 is a cross-sectional view of a first probe according to an embodiment, FIG. 6 is a view illustrating a function of the first probe illustrated in FIG. 5, and FIG. 7 is a view illustrating a modified embodiment of the first probe illustrated in FIG. 5.

Referring to FIG. 5, the first probe 2210 may include a contact portion 2211 in contact with the case 110 during a test, an accommodation portion 2213 in which a portion of the contact portion 2211 is accommodated, and a connecting portion 2215 connecting the contact portion 2211 to the accommodating portion 2213.

According to an embodiment, the connecting portion 2215 may be an elastic member, for example, a spring capable of being compressed and deformed in the longitudinal direction (Z-direction) of first the probe 2210. Accordingly, a position of the contact portion 2211 may be adjusted in the longitudinal direction (Z-direction) with respect to the case 110 when pressure is applied, and despite the metal mesh 2217, positions of a plurality of first probes 2210 in the longitudinal direction (Z-direction) may be individually adjusted.

Since the case 110 of the pouch cell 100 may not have a uniform surface unlike a prismatic cell, when the first probe 2110 is provided in a rigid type, contact may not be ensured at some points. However, when the first probe 2210 is provided to fluctuate in the longitudinal direction (Z-direction) as in an embodiment of the disclosed embodiment, contact of the pouch cell 100 of the first probe portion 220 may be ensured.

Meanwhile, the first probe 2210, more specifically, an end 2111*a* of the contact portion 2111 may be in contact with the case 110. For example, the end 2111*a* in contact with the case 110 may have a flat shape to prevent damage to a surface of the case 110 or a round shape as illustrated in FIG. 7.

According to the disclosed embodiment, the cell insulation test apparatus 200 may be in contact with the case 110 at several points because the first probe portion 220 may be provided as the probe assembly 221. Accordingly, the probability of detecting insulation defects that may occur at any point of the pouch cell 100 may increase.

Meanwhile, sparks may occur at points in which insulation defects are present in the pouch cell 100. The cell insulation test apparatus 200 according to the disclosed technology may further include a capturing portion 250 that confirms and specifies a spark generation position (i.e., an insulation defect position). The spark generation position may be confirmed with the naked eye, but when confirmed through the capturing portion, a process of specifying the insulation defect position may be automated.

For example, the capturing portion 250 may be a camera, and may include a first capturing portion 251 disposed in the Z-direction, a second capturing portion 252 disposed in the X-direction, and a third capturing portion 253 disposed in the Y direction, based on the drawing. The number and position of the capturing portions 250 may be changed as necessary.

Meanwhile, in the case of an insulation test using the cell insulation test apparatus 200 described above, after measuring insulation resistance on one surface of the case 110, an opposite surface is measured. However, according to another embodiment, it may be possible to simultaneously measure the insulation resistance on both surfaces of the case 110.

Figure 8:
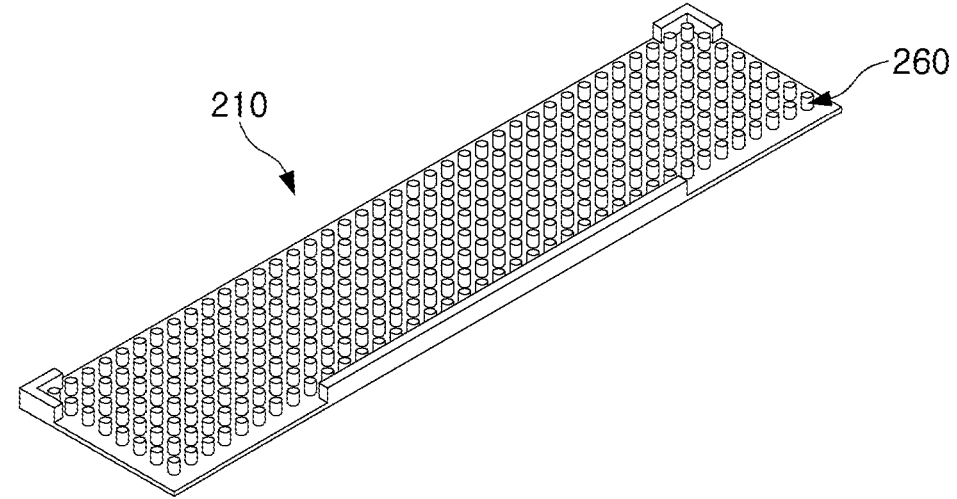
FIG. 8 is a view illustrating a modified embodiment of a cell jig illustrated in FIG. 2.

FIG. 8 is a view illustrating a modified embodiment of a cell jig illustrated in FIG. 2.

Referring to FIG. 8, the cell jig 210 may include a third probe portion 260 on a bottom surface on which a wide surface of the pouch cell 100 is settled. The third probe portion 260 may be in contact with the case 110 on a side opposite to the first probe portion 220. That is, the first probe portion 220 may be in contact with one surface of the case 110, and the third probe portion 260 may be in contact with the other surface of the case 110.

The third probe portion 260 may include a probe assembly 261 including a plurality of probes provided in a matrix arrangement like the first probe portion 220, and the cell jig 210 itself may perform a function similar to that of the insulating cover 225 of the first probe portion 220. The description of the first probe portion 220 may be equally applied to the third probe portion 260, and a detailed description thereof will be omitted.

Next, a cell insulation test method using the cell insulation test apparatus 200 according to the disclosed embodiment will be described with reference to FIGS. 9 to 12.

Figure 9:
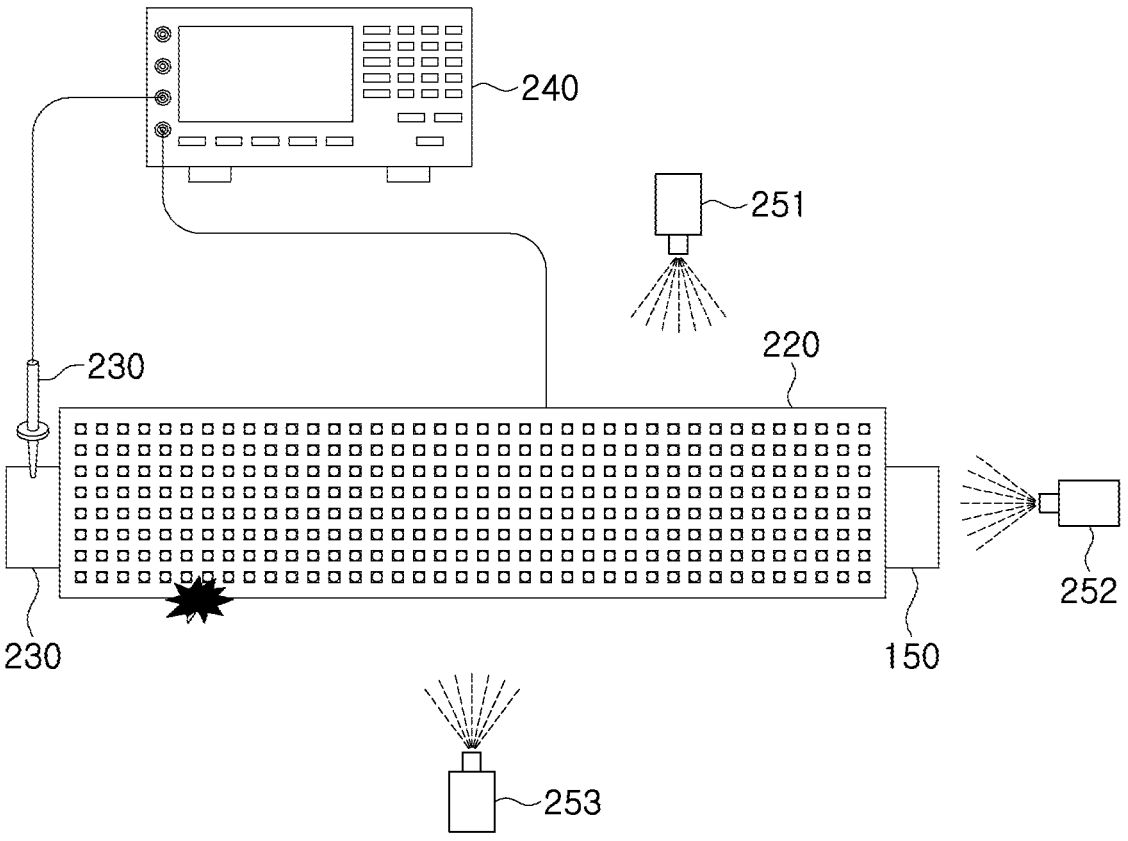
FIG. 9 is a view illustrating an example of detecting insulation defects of a pouch cell using the test apparatus illustrated in FIG. 2.
Figure 10:
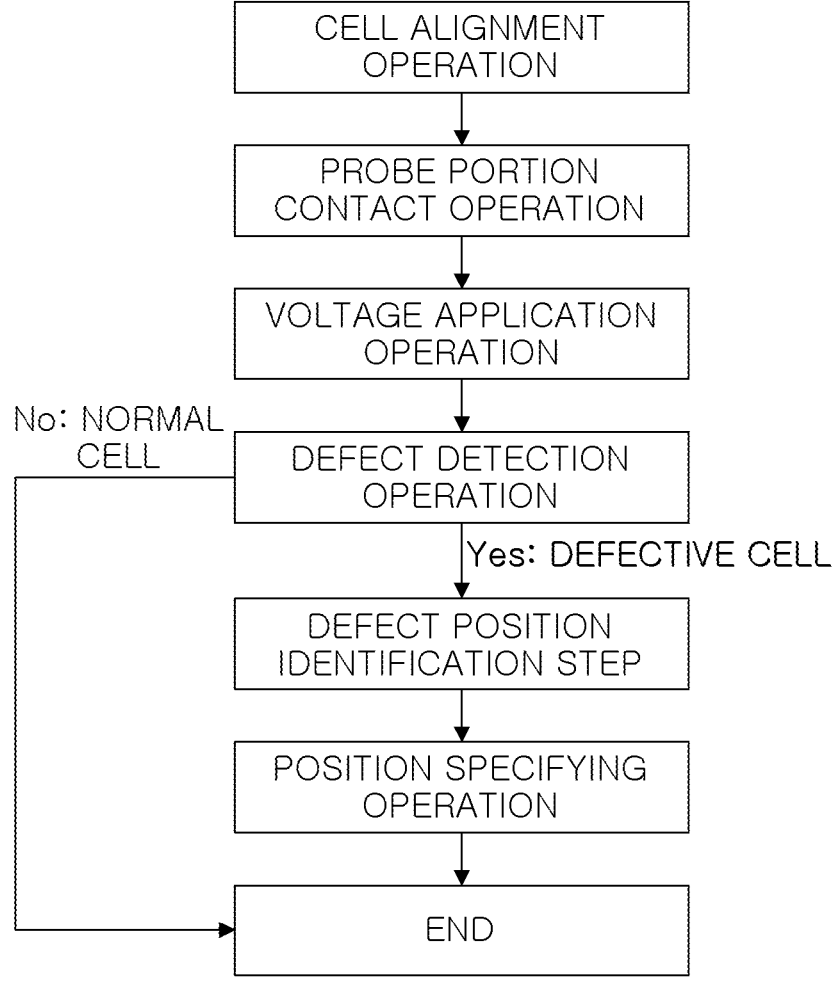
FIG. 10 is a view illustrating a cell illustration test procedure using the test apparatus illustrated in FIG. 9.
Figure 11:
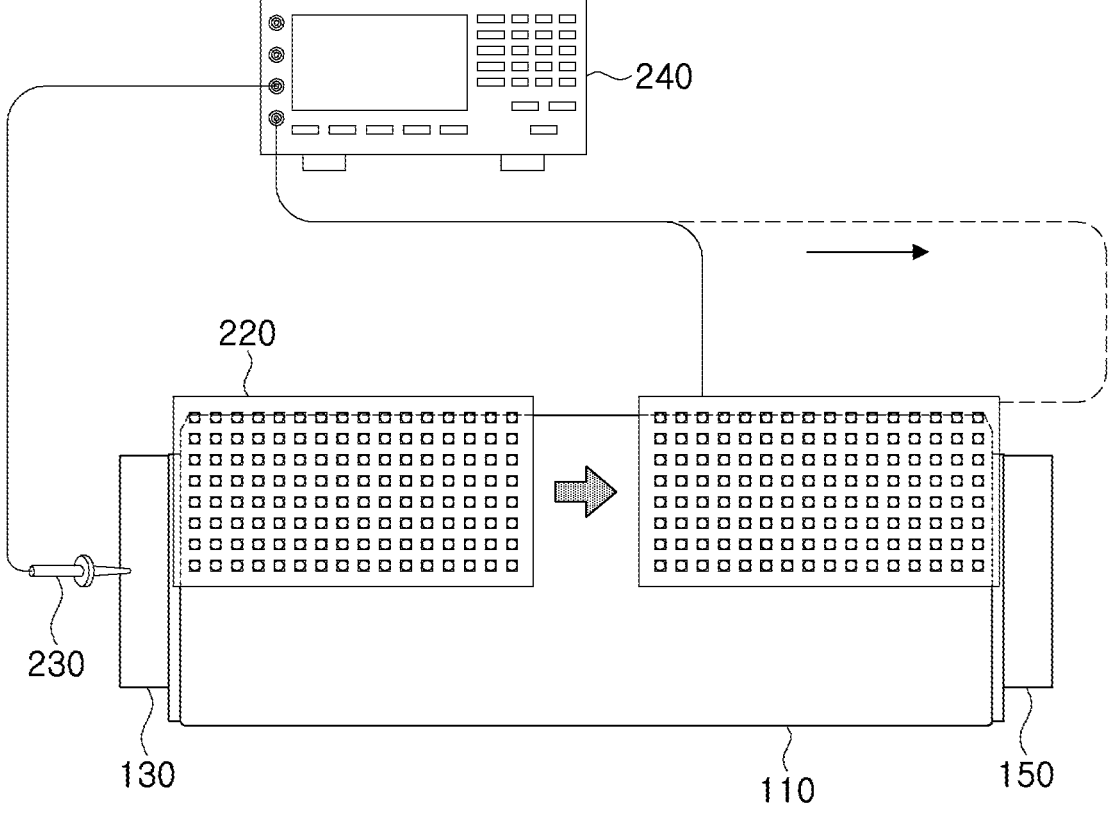
FIGS. 11 and 12 are views illustrating an example of detecting insulation defects of a pouch cell using a test apparatus according to a modified embodiment.
Figure 12:
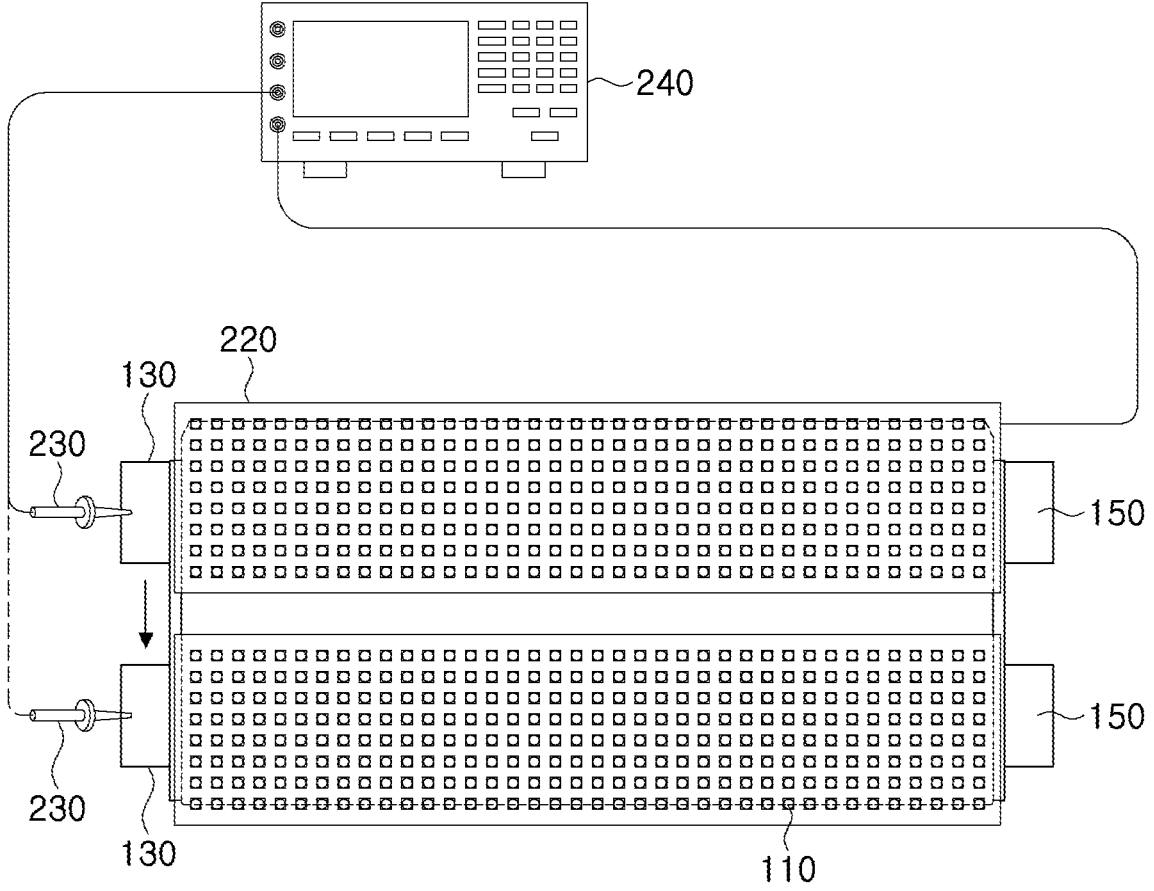

FIG. 9 is a view illustrating an example of detecting insulation defects of a pouch cell using the test apparatus illustrated in FIG. 2, FIG. 10 is a view illustrating a cell illustration test procedure using the test apparatus illustrated in FIG. 9, and FIGS. 11 and 12 are views illustrating an example of detecting insulation defects of a pouch cell using a test apparatus according to a modified embodiment.

For an insulation test of the pouch cell 100, the pouch cell 100 may be settled on the cell jig 210. A position of the pouch cell 100 may be aligned while the pouch cell 100 is settled on the cell jig 210. In a state in which the pouch cell 100 is settled on the cell jig 210, the first probe portion 220 and the second probe portion 230 may be brought into contact with the case 110 and a negative electrode tab 130 of the pouch cell 100, respectively, and insulation defects of the pouch cell 100 may be detected by applying test voltage through the tester 240. Through the test, the pouch cell 100 in which no insulation defects are detected may be immediately classified as a normal cell or may be tested once again by increasing a test voltage.

On the other hand, through the test, the pouch cell 100 in which the insulation defects are detected may be classified as a defective cell and may further undergo some procedures.

When the pouch cell 100 has insulation defects, an insulation resistance value of the pouch cell 100 may be measured to a significant level lower than that of the normal cell. The insulation resistance value may be calculated through Equation 1 below.

$$R_{total} = \cfrac{1}{\cfrac{1}{R1} + \cfrac{1}{R2} + \cfrac{1}{R3} + \ldots} \qquad \text{Equation 1}$$

Normal cells or defective cells may be classified based on the insulation resistance value calculated through Equation 1 above, and a value that serves as classification standard may be set differently according to test conditions or the like.

In the case of the pouch cell 100 having insulating defects, when test voltage is applied, sparks may occur at a defect position as described above. The spark generation position may be identified and specified through the capturing portion 250. Furthermore, a repair procedure for solving the insulation defects may be further performed.

When the insulation test on one surface of the case 110 is completed, the insulation test may be performed on an opposite surface through the same procedure. In other words, the above-described process may be repeated in the pouch cell 100 in a state in which the one surface on which the insulation test has been performed is settled on the cell jig 210 to face a bottom surface thereof. Alternatively, as illustrated in FIG. 8, when the cell jig 210 includes the third probe portion 260, insulation tests on one surface and the opposite surface of the case 110 may be performed simultaneously.

Meanwhile, as illustrated in FIG. 9, the first probe portion 220, more specifically, the probe assembly 221 may have an area approximately equal to one surface of the case 110 on which the probe assembly 221 is disposed. However, in another embodiment, as illustrated in FIGS. 11 and 12, the area of the probe assembly 221 may be smaller or larger than one surface of the case 110.

For example, the first probe portion 220 may include a probe assembly 221 having an area smaller than an area of one surface of the case 110. In this case, an insulation test may be performed on one surface of the case 110 while moving the first probe portion 220. During the insulation test, the first probe portion 220 may be moved in the X-direction or the Y-direction. In another example, the first probe portion 220 may include a probe assembly 221 having an area larger than an area of one surface of the case 110. In this case, the insulation test may be simultaneously performed on the two pouch cells 100 or more pouch cells 100.

Although the configurations and characteristics of the present disclosure have been described based on the example embodiment of the present disclosure, the present disclosure is not limited thereto, and it will be apparent to those skilled in the art to which the present disclosure belongs that various changes or modifications may be made within the concept and scope of the present disclosure, and thus it will be revealed that such changes or modifications fall within the scope of the appended claims.

What is claimed is:

1. A secondary battery cell insulation test apparatus, comprising:
a first probe portion disposed to be in contact with a case of a secondary battery cell;
a second probe portion disposed to be contact with an electrode tab of the secondary battery cell; and
a tester for measuring insulation resistance of the secondary battery cell in a state in which the first probe portion and the second probe portion are disposed to be in contact with the secondary battery cell,
wherein the first probe portion includes a probe assembly contact the case at a plurality of points,
wherein the probe assembly includes a plurality of first probes that contact the case and are interconnected to each other at one end,
wherein the plurality of first probes are arranged at regular intervals while forming a plurality of rows and columns.

2. The secondary battery cell insulation test apparatus of claim 1, wherein the first probe portion is in the form of a roller or a plate.

3. The secondary battery cell insulation test apparatus of claim 1, wherein the plurality of first probes are able to adjust a position in a direction facing the case.

4. The secondary battery cell insulation test apparatus of claim 3, wherein ends of the plurality of first probes are in contact with the case, and the ends of the plurality of first probes have a flat shape or round shape.

5. The secondary battery cell insulation test apparatus of claim 3, wherein the plurality of first probes comprise:
a contact portion in contact with the case;
an accommodation portion in which a portion of the contact portion is accommodated; and
a connection portion connecting the contact portion and the accommodation portion,
wherein the connection portion is provided with an elastic member that is deformable in a longitudinal direction of the contact portion.

6. The secondary battery cell insulation test apparatus of claim 1, further comprising: a cell jig on which the secondary battery cell is settled.

7. The secondary battery cell insulation test apparatus of claim 6,
wherein the probe unit is arranged to contact a first surface of the case,
wherein the cell jig further comprises a third probe portion disposed to contact a second surface of case, and
the third probe portion comprises a probe assembly to come into contact with the case at a plurality of points.

8. The secondary battery cell insulation test apparatus of claim 1, further comprising:
a capturing portion to confirm and specify an insulation defect position in the secondary battery cell.

9. The secondary battery cell insulation test apparatus of claim 1, wherein the secondary battery cell in contact with the first probe portion and the second probe portion is a pouch-type secondary battery cell.

10. The secondary battery cell insulation test apparatus of claim 1, wherein the probe assembly further comprises a metal mesh supporting the plurality of first probes.

11. The secondary battery cell insulation test apparatus of claim 10, wherein the probe assembly further comprises an insulating cover on which the metal mesh is disposed.

12. A secondary battery cell insulation test method, comprising:

a contact operation of bringing a case and an electrode tab of a secondary battery cell into contact with a first probe portion and a second probe portion, respectively;

a voltage application operation of applying test voltage to the secondary battery cell in a state in which the first probe portion and the second probe portion are in contact; and a defect detection operation of determining whether defects are present in the secondary battery cell by measuring an insulation resistance value of the secondary battery cell, wherein the first probe portion comprises a plurality of first probes to contact with the case at a plurality of points, wherein the plurality of first probes are arranged at regular intervals while forming a plurality of rows and columns.

13. The secondary battery cell insulation test method of claim 12, wherein in the defect detection operation, when an insulation resistance value of the secondary battery cell is measured to be lower than a preset reference value, the secondary battery cell is determined to have insulation defects.

14. The secondary battery cell insulation test method of claim 12, further comprising:

when the secondary battery cell is determined to have insulating defects, a position specifying operation of specifying an insulating defect position of the secondary battery cell through a capturing portion.

15. The secondary battery cell insulation test method of claim 14, wherein in the position specifying operation, a defect position of the secondary battery cell is specified as a coordinate.

16. The secondary battery cell insulation test method of claim 12, wherein a position of the secondary battery cell is aligned in a state in which the secondary battery cell is settled on the cell jig, the cell jig includes a plurality of third probes that form contact with the case at a plurality of points, and insulation tests are simultaneously performed on both surfaces of the case through the plurality of first probes and the plurality of third probes.

* * * * *